(12) United States Patent
Babcock

(10) Patent No.: US 6,703,906 B2
(45) Date of Patent: Mar. 9, 2004

(54) SYSTEM AND METHOD FOR PROGRAMMING OSCILLATORS

(75) Inventor: David J. Babcock, Plainfield, NJ (US)

(73) Assignee: Cardinal Components, Inc., Wayne, NJ (US)

(*) Notice: Subject to any disclaimer, the term of this patent is extended or adjusted under 35 U.S.C. 154(b) by 0 days.

(21) Appl. No.: 10/145,976

(22) Filed: May 14, 2002

(65) Prior Publication Data

US 2002/0149435 A1 Oct. 17, 2002

Related U.S. Application Data

(63) Continuation-in-part of application No. 09/504,176, filed on Feb. 15, 2000, now Pat. No. 6,388,532.

(51) Int. Cl.[7] ................................................ H03B 5/32
(52) U.S. Cl. .................. 331/158; 331/66; 331/176; 331/116 R; 331/69; 331/68
(58) Field of Search ........................... 331/18, 16, 66, 331/17, 176, 68, 69, 158, 175, 116 R

(56) References Cited

U.S. PATENT DOCUMENTS

| | | | | |
|---|---|---|---|---|
| 5,801,594 A | * | 9/1998 | Muto et al. | 331/158 |
| 5,994,970 A | * | 11/1999 | Cole et al. | 331/68 |
| 6,066,989 A | * | 5/2000 | Knecht et al. | 331/18 |
| 6,388,532 B1 | * | 5/2002 | Babcock | 331/44 |

OTHER PUBLICATIONS

Integrated Circuits for Wireless Communications, Abidi et al, IEEE Press, p. 431, 1998.*
IEEE Standard Dictionary of Electrical and Electronics Terms, IEEE, NY, p. 899, 1984.*

* cited by examiner

Primary Examiner—Arnold Kinkead
(74) Attorney, Agent, or Firm—Milde & Hoffberg LLP

(57) ABSTRACT

A system and method for programming a digitally tunable oscillator is provided. A desired output frequency is received. A tuning effect of a set of digital tuning words on a crystal resonant frequency is determined, and valid parameters of an algorithm for translating and tuning the crystal resonant frequency to a value within an error tolerance of the desired frequency, based on the determined tuning effect are calculated. Valid parameters are preferably calculated based on an intermediate tuning value, sorted by ascending divide parameter of the algorithm, and then evaluated in sorted order for ability of a tuning effect to null frequency error to within the error tolerance. The valid set of calculated parameters are then programmed into a nonvolatile memory. The oscillator control parameters may remain unprogrammed until all necessary parameters are defined. Because the device may be programmed in a single step, without intermediate presumption of nominal crystal frequency, the final plate process may be unnecessary. A high accuracy may be obtained by searching through the complete set of available parameters for a set that meets a frequency and tolerance specification. The oscillator is preferably a Cypress CY2037 device alone or in combination with a Micro Analog Systems MAS1175 device.

24 Claims, 15 Drawing Sheets

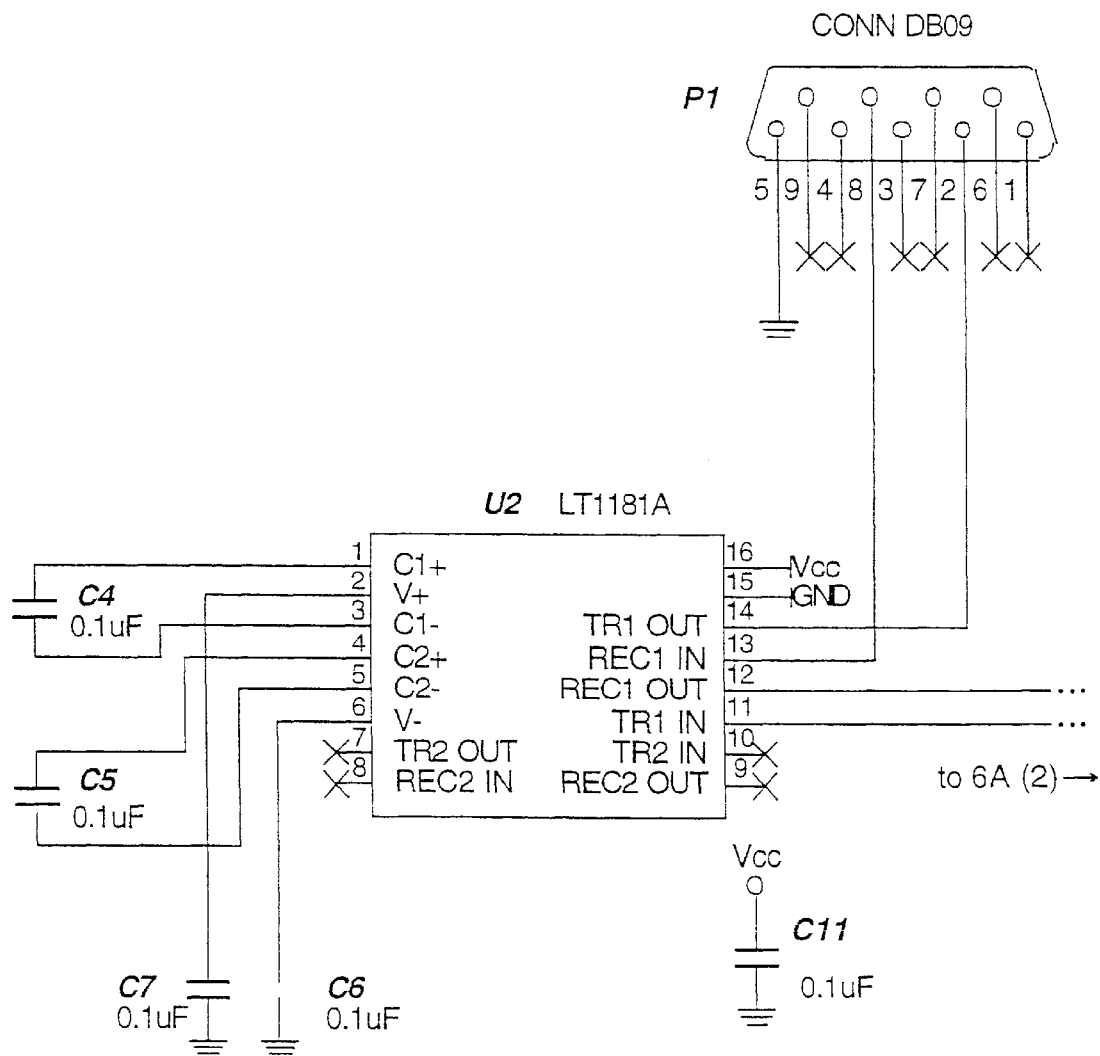
FIG. 6A (1)

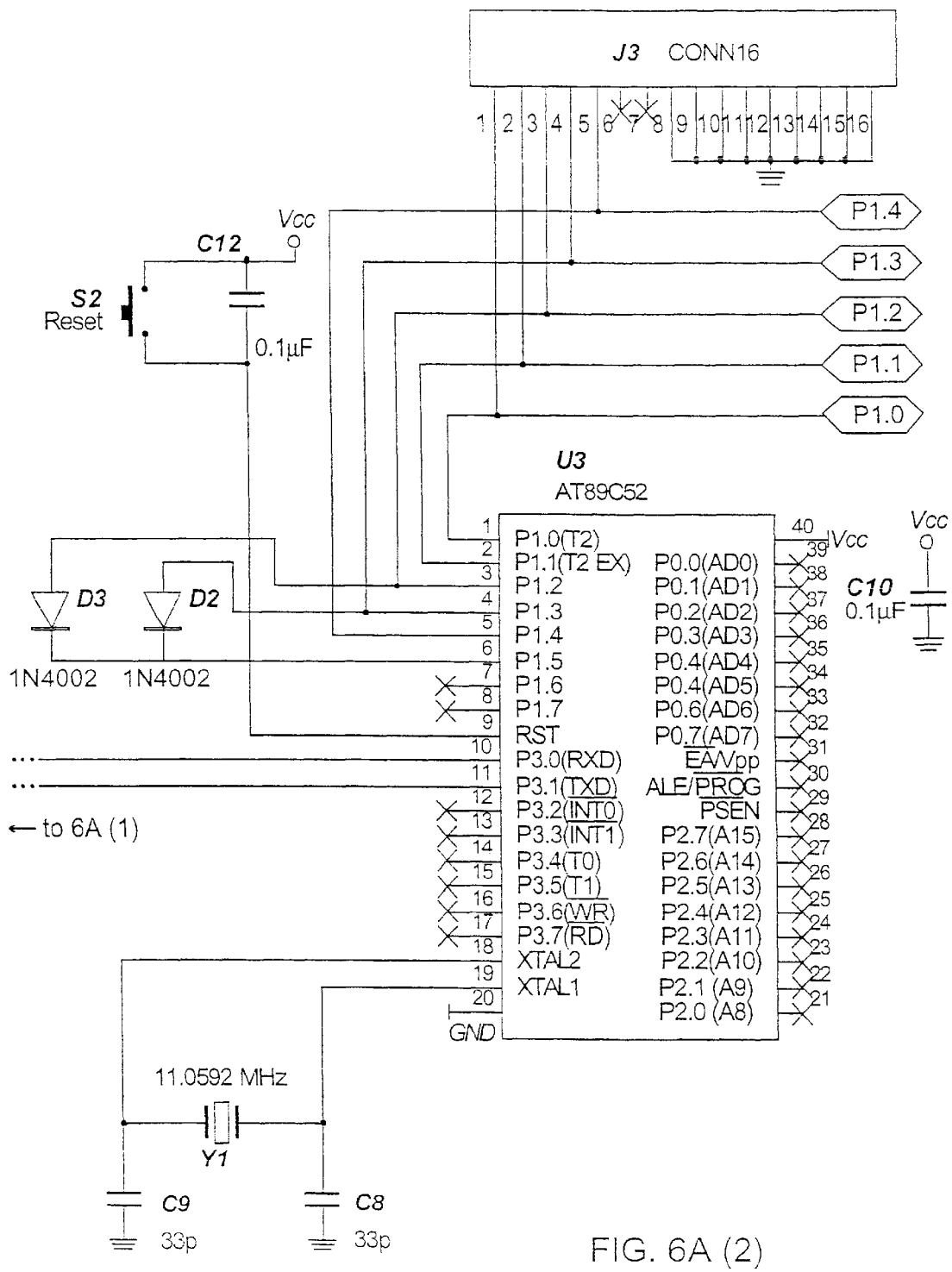
FIG. 6A (2)

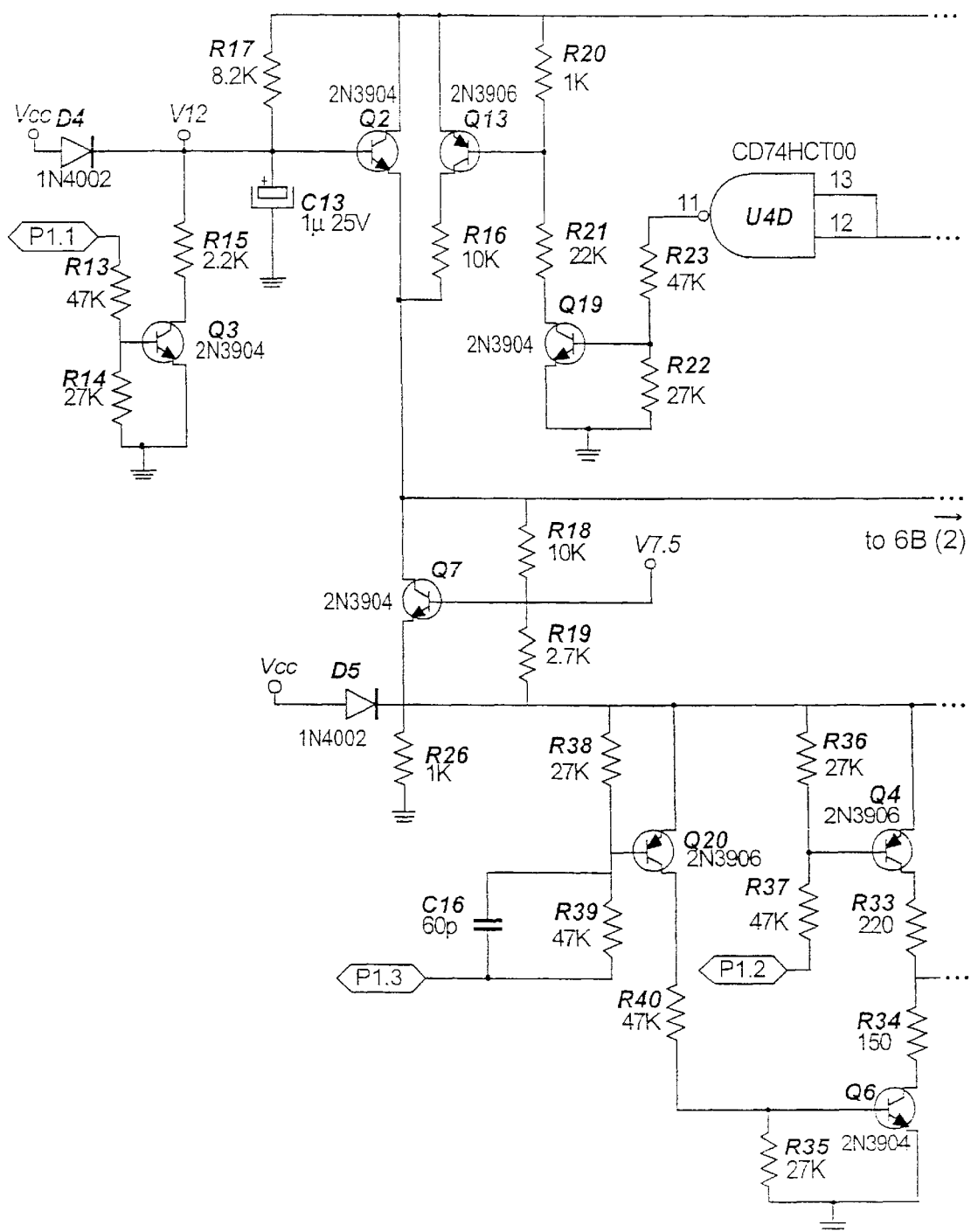
FIG. 6B (1)

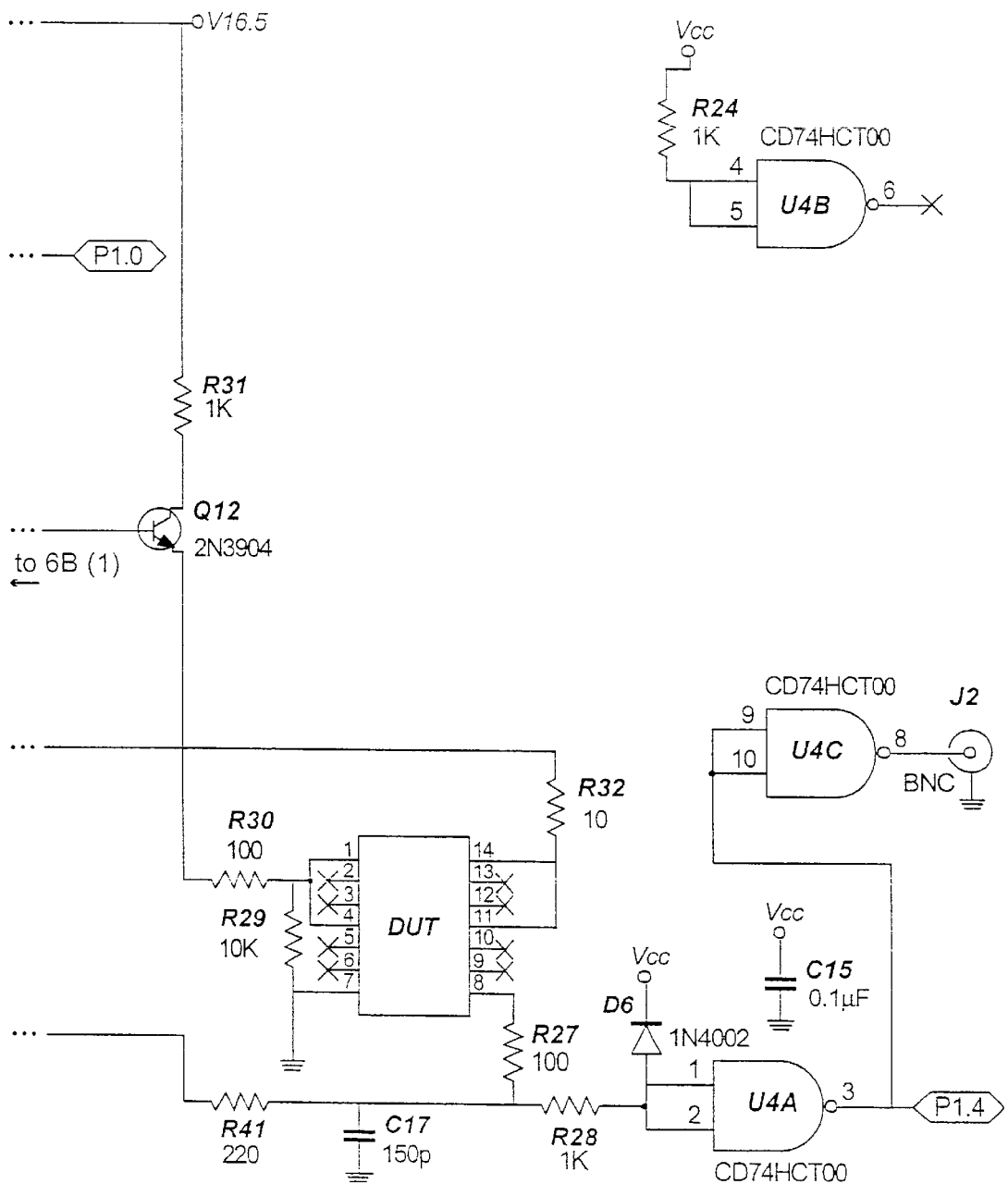
FIG. 6B (2)

SYSTEM AND METHOD FOR PROGRAMMING OSCILLATORS

The present application is a Continuation-in-part of U.S. patent application 091/504,176 filed Feb. 15, 2000, now U.S. Pat. No. 6,388,532 issued May 14, 2002.

FIELD OF THE INVENTION

The present invention relates to the field of programmable oscillators, and more particularly to systems and methods including high accuracy EPROM programmable phase locked loop oscillators.

BACKGROUND OF THE INVENTION

The CY2037 from Cypress Semiconductor Corporation (San Jose, Calif.), is an EPROM-programmable (electrically programmable read only memory), high-accuracy and resolution, PLL-based (phase-locked loop) digitally controlled crystal oscillator (DCXO). The device has a low jitter specification, e.g., $<\pm100$ ps (pk—pk) at 5V and f>33 MHz and $<\pm125$ ps (pk—pk) at 3.3V and f>33 MHz. The device is available die form, i.e., without packaging, and attaches directly to a 10–30 MHz crystal. The oscillator device may be packaged into various through-hole or surface mount packages. A block diagram of this circuit is shown in FIG. 1A.

Traditionally, an oscillator crystal is calibrated in an operation termed the "final plate", from an initial accuracy of within 2,000–3,000 ppm from the nominal frequency desired to within 10–25 ppm (typical) from the nominal desired frequency. This is a significant mechanical step, and constitutes the final calibration of the oscillator after it is mounted in a module. The final plate involves selectively depositing a film or plating of metal on a prepared pre-plate portion of the surface of the crystal, to mechanically alter the resonant frequency of the crystal. This process is typically manually assisted, requiring a skilled technician to carefully apply the plating to adjust the operating frequency of the crystal. Not only the thickness, but also the placement of the plating is critical; if it is not exactly concentric over the pre-plate region, phase noise and jitter are increased. In fact, as a rule, phase noise and jitter increase after the final plate. The final plate process also results in loss of yield. For example, there is a probability of plating adhesion failure. Further, the final plate process is performed with the crystal exposed, and thus more sensitive to environmental influences. After the crystal is tuned by the final plate, the crystal is sealed. Thus, the final plate process is expensive, labor consuming, reduces crystal quality, and potentially induces defects.

Precision crystal oscillators (PXO) such as the Micro Analog Systems (Espoo, Finland) MAS9271 and MAS1173, which include a digitally controlled capacitive tuning network for trimming a crystal frequency, are typically calibrated and operated independently of a digital frequency synthesizer. Thus, using a PXO, a crystal is tuned to a desired frequency, to within a small tolerance. This may include a final plate process. The digital frequency synthesizer is then programmed using the nominal multiply and divide values to achieve the desired output frequency.

In principle, the oscillator devices can be stocked as blank parts and custom frequencies programmed in-package at the last stage before shipping from an oscillator manufacturer. This would enable fast-turn manufacture of custom and standard crystal oscillators without the need for dedicated, expensive crystals or inventory of customized assemblies. In this case, the oscillators are not field programmable, and an integrator of oscillators into products must still specifically order a particular oscillator at a predefined frequency, and must still await the customization by the oscillator manufacturer and incur potential set-up charges, which may be significant for small orders, as well as the added cycle time of days or weeks.

The CY2037 contains an on-chip oscillator and a separate oscillator tuning circuit for fine-tuning of the output frequency. The crystal capacitive load can be selectively adjusted by programming a set of seven EPROM bits. This feature is typically used to compensate for crystal variations or to obtain a more accurate synthesized frequency.

The typical use of a programmable oscillator starts with an oscillator crystal trimmed to a nominal value. Then, the oscillator circuit is permanently programmed (in EPROM) with the multiply and divide ratios. Finally, at least in the case of the CY2037, the operating frequency of the crystal is tuned with the tuning bits to achieve a desired maximum error.

The CY2037 PLL die has a very high resolution. It has a 12-bit feedback counter multiplier and a 10-bit reference counter divider. This enables the synthesis of highly accurate and stable output clock frequencies with low error, for example zero or low parts per million (ppm) The clock can be further modified by eight output divider options of 1, 2, 4, 8, 16, 32, 64 and 128. The divider input can be selected as either the PLL or crystal oscillator output, providing a total of sixteen separate output options. The output is selectable between TTL and CMOS duty cycle levels.

The nominal output frequency of the PLL is determined by the following formula:

$$F_{PLL}=2\times(P+5)/(Q+2)\times F_{REF}$$

where P is the feedback counter value and Q is the reference counter value. P and Q are EPROM programmable values.

One version of the CY2037 contains a special tuning circuit to fine-tune the output frequency of the device. The tuning circuit consists of an array of eleven logarithmically sized load capacitors on both sides of the oscillator drive inverter. The capacitor load values are EPROM programmable with seven Osc_Tune bits, and can be increased in small increments. As the capacitor load is increased the circuit is fine-tuned to a lower frequency. The capacitor load values vary from 0.17 pF to 8 pF for an approximate 100:1 total control ratio.

The CY2037 uses EPROM programming with a simple 2-wire, 4-pin interface that includes VSS and VDD. Clock outputs can be generated up to 250 MHz. According to the design, the entire configuration of the EPROM can be reprogrammed one time, allowing programmed inventory to be altered or reused. The CY2037 includes a 44 bit by 2 row EPROM block, which holds all of the configuration information. The programming word contains the data from the EPROM and a row select (RowSel) bit, which determines the row being accessed during normal operation. Cypress advises that the bit should match in both rows, and therefore, when row 0 is programmed, row 1 is otherwise left unprogrammed, with the RowSel bit row 0 programmed to 0. When row 1 is programmed, the RowSel bit of row 0 is programmed to 1, a permissible overwrite.

The CY2037 contains a shadow register in addition to the EPROM register, which is optionally disabled. The shadow register is an exact copy of the EPROM register and is the default register when the Valid bit is not set. It is useful when the prototype or production environment calls for measuring and adjusting the CLKOUT frequency multiple times. Multiple adjustments can be performed with the shadow register. Once the desired frequency is achieved, the EPROM register is permanently programmed.

Accordingly, the following essential features of the CY2037 are controlled based on data stored in the EPROM; Feedback counter value (P); Reference counter value (Q); Output divider selection; Oscillator Tuning (load capacitance values); Duty cycle levels (TTL or CMOS); Power management mode (OE or PWR_DWN); Power management timing (synchronous or asynchronous); and Output Source Frequency (PLL or Crystal).

A PLL-based frequency synthesizer uses a reference input to generate output clocks. The reference can be provided by a quartz crystal or an external clock source. The accuracy and stability of the output clocks in a PLL-based frequency synthesizer are directly proportional to those of the reference. Thus, it is important to provide a stable, accurate, and appropriate reference input.

Jitter is an effect caused by an irregularity in the crystal oscillation and/or logic transitions of the circuit electronics. This can be caused by rapid changes in power supply voltage, logic transition voltage, stochastic processes, radio frequency interferences, or the like.

FIG. 1 shows the block diagram of a CY2037 PLL-based frequency synthesizer. The reference input to the PLL comes from an on-chip crystal oscillator. FIG. 2 shows the circuitry of the on-chip crystal oscillator (a.k.a. Pierce oscillator), which is formed by components R, G, Ci and Co, where G is a linear inverter. For this circuit to produce an electrical clock, a quartz crystal needs to be connected between the XTALIN and XTALOUT pins.

The equivalent circuit of a Quartz crystal is shown in FIG. 3. $C_0$ is the shunt or static capacitance of the crystal. $R_1$ is the motional resistance, $L_1$ is the motional inductance, and $C_1$ is the motional capacitance of the crystal. $R_1$, $L_1$ and $C_1$ are determined by the mechanical properties of the crystal (they are in the motional arm of the crystal and their circuit effects only exist when the crystal is oscillating). The effective reactance curve of the crystal is shown in FIG. 4. Thus, it is seen that slight variations in the fabrication of the quartz crystal will alter the nominal output frequency.

When connected as a feedback element in a oscillator circuit that has a 0° phase shift, the crystal oscillates at the series resonating frequency (f s) given by Eq. 1:

$$f_s = 1/(2\pi\sqrt{(L_1 C_1)}) \qquad \text{Eq. 1}$$

A Pierce oscillator has a 180° phase shift on the amplifier and needs another 180° phase shift from the feedback element. The feedback element in this case is a crystal along with a capacitive load, and the frequency of oscillation of the crystal (and oscillator circuit) is in the "area of parallel resonance". The actual value of the crystal oscillator parallel resonating frequency is dependent on the capacitive loading seen by the crystal and is given by Eq. 2:

$$f_p = f_s(1 + C_1/2(C_0 + C_L)) \qquad \text{Eq. 2}$$

where $C_L$=Capacitive loading seen by the crystal.

For example, a parallel resonant crystal tuned to a particular $C_{load}$, will oscillate at a predetermined frequency when it is placed in a Pierce oscillator (parallel oscillator) circuit which offers a capacitive loading $C_L = C_{load}$. If the capacitive loading seen by the crystal in the Pierce oscillator circuit were different from the rated $C_{load}$, the change in frequency from the rated frequency is given by Eq. 3:

$$(f_{p(rated)} - f_{p(actual)})/f_{p(rated)} = C_1/2((1/(C_0 + C_L)) - 1/(C_0 + C_L)) \qquad \text{Eq. 3}$$

where:

$f_{p(rated)}$=frequency rating of crystal $f_{p(actual)}$=actual frequency of oscillation in oscillator circuit $C_{load}$=Capacitive loading rating of crystal $C_L$=Capacitive loading seen by crystal in oscillator circuit.

Thus, a trim capacitor network would be expected to tune the circuit for variations in the crystal, allowing fine calibration of the operating frequency. This effect is analytic, and therefore the alteration in operating frequency due to a change in capacitance may be predicted with accuracy.

Typically, the selected EPROM register of the CY2037 device is programmed with appropriate multiply (P) and divide (Q) ratios, to achieve a desired output frequency, typically slightly above the desired final frequency. The controller calculates the multiply and divide ratios based on the output of the frequency counter and an algorithm therein, known in the art. After the P and Q are programmed into the device, the output of the oscillator is measured over a number of conditions of tuning, for example testing the effect on the output for each of the tuning bits. The controller then determines an optimal set of tuning bits and these are programmed into the EPROM. Thus, the DCXO is normally first programmed based on a nominal oscillator frequency, and the oscillator frequency then adjusted by trimming to achieve the desired output.

Oscillators will often have an intrinsic sensitivity to temperature. Thus, the output frequency will vary from a nominal value with changes in operating temperature. It is known to compensate for these changes using a so-called TCXO, or temperature compensated crystal oscillator. The temperature compensation network may be analog or digital. Often, it is desired to provide a crystal controlled oscillator with a stable frequency, which is controllable by an external voltage. This is called a voltage controlled crystal oscillator, or VCXO. For example, high precision phase locked loops, and radio frequency transceivers may use these devices. Many TCXO devices also provide VCXO functionality, and are called voltage controlled, temperature compensated crystal oscillators (VCTCXO).

Essentially, modem TCXO and VCXO devices operate by altering a capacitive loading on the oscillator crystal in dependence on a sensed voltage. This is typically performed using a varactor (a diode whose capacitance varies with reverse-bias voltage), which responds to an analog control voltage. This provides a stepless analog control, in contrast to the use of switched capacitor networks used to trim the capacitive load.

Micro Analog Systems (Espoo, Finland, www.masoy.com) produces a voltage controlled, temperature compensated crystal oscillator (VCTCXO) circuit, MAS1175, a block diagram of which is shown in FIG. 8, which provides a three point temperature compensation, a serial bus for programming and trim, EPROM storage of parameters, and analog compensation. Thus, a digital capacitive trimming network and analog capacitive control network are both provided. The circuit requires an external crystal and varactor.

SUMMARY AND OBJECTS OF THE INVENTION

The present invention provides a number of enhancements to digitally controlled oscillator systems. According to a first embodiment, the present invention provides a system and method for field programming an EPROM programmable oscillator device, using a relatively simple programmer device and a terminal or personal computer.

According to another aspect of the invention, the final plate process for tuning the crystal is eliminated, and the processes of electronically tuning the crystal and selecting operating parameters for a digital frequency synthesizer are consolidated in a single process. Thus, by treating the tuning registers for the crystal oscillator as an integral part of the frequency control of the output, a production step is eliminated, greater flexibility in selecting operating parameters is obtained, and quality is improved.

The EPROM programmable oscillator device preferably includes electronically controllable tuning of crystal frequency as well as high precision frequency synthesis. According to the present invention, these two attributes are combined to dispense with the necessity of the final plate, and, for example, to thereby increase output quality (reduced phase noise and jitter), increase product quality (reduce probability of environmental contamination of crystal or delamination of plating), decrease costs, decrease skilled manual labor required, decrease manufacturing cycle time (and allow decentralization of final production steps with field programmability), allow standardization of completely manufactured oscillators, and/or increase manufacturing yield.

The present invention also provides a further enhancement for reducing oscillator jitter. In testing an oscillator designed using a quartz crystal and CY2037 packaged in an industry standard 5×7 mm metal package with ceramic substrate, over a frequency range (output) of 10–120 MHz, jitter ranged from 95–220 ps (bimodal distribution)(25,000 samples). However, when an internal power supply bypass capacitor of between 10 nF and 100 nF was placed inside the package, jitter was reduced to between 55–120 ps (Gaussian-type distribution) (25,000 samples). Typically, bypass capacitors are placed on the component circuit board, not within the oscillator package, therefore, this significant advantage was surprising. It is likely that this reduction in jitter results from the inductance of the package leads. By providing the bypass capacitor within the oscillator package, the circuit is better isolated from the effects of this inductance. According to the present invention, it is also possible to provide the internal bypass capacitor in conjunction with tuning the inductance of the power supply lines leading to the circuit, to form a filter, to further reduce jitter.

Advantages of field programmability include reduced prototype and manufacturing cycle time, and allowing oscillator users to inventory unprogrammed parts, which are programmed to specification as needed.

Oscillators according to the present invention provide programming capability of greater than 6 significant digits of accuracy, over a frequency range of 1 to 250 MHz, covering both the commercial and industrial temperature ranges. Temperature compensated versions as well as voltage controlled versions, are also within the scope of the invention.

In order to provide a temperature-compensated high-resolution digitally controlled oscillator, one embodiment provides a VCTCXO circuit output as an input (replacing the crystal at $X_G$) for the CY2037 DCXO. The internal trim capacitors of the CY2037 are not employed, and versions of the device where these are unavailable may be employed. In programming this system, the VCTCXO control parameters are first calculated, for example with compensation determined at three different temperatures. The control parameters may be programmed, to test the nominal (untrimmed) output, or the predicted output may be used, but the trimming network parameters remain unprogrammed. The various P, Q and divider values of the DCXO and the capacitive trimming network parameters may together be calculated and then programmed.

Likewise, the present invention also provides an integrated (e.g., single integrated circuit) high resolution DCVCTCXO. In this case, the internal capacitive trimming may coexist with the temperature compensation, voltage control and logic control circuitry. Advantageously, the control electronics for all functions use a single serial interface and set of non-volatile control registers.

The process for programming the DCXO (CY2037) essentially determines the free crystal oscillator operating frequency, for example over a range of available tuning values, and then calculates the optimal P, Q, divider select and tuning value to achieve the desired oscillator operating frequency with acceptable error (ppm), with the lowest Q value. Therefore, in contrast to typical prior art methods, the crystal tuning is performed simultaneously with selection of oscillator parameters P, Q, and divider select, rather than beforehand. This results in greater flexibility for optimizing the various parameters. In this process, therefore, the P, Q and divider select parameters may vary between oscillators that meet the same output frequency specification, due to differences in the crystal and tuning parameters.

Therefore, one aspect of the invention provides a high precision oscillator system that does not require a finely tuned oscillator crystal. Another aspect of the invention provides that the oscillator is programmed with both fine-tuning of crystal operating frequency and output frequency translation in a consolidated operation. A further aspect of the invention provides a programming device for a programmable oscillator, which selects optimum crystal frequency tuning and frequency synthesis in a single operation.

Therefore, the present invention provides a human user interface system and method that provides an interface with a programmable oscillator device, for programming thereof, which meet all or some of the objects identified herein.

Initially, the nominal frequency of the crystal is measured using a frequency counter. This frequency is preferably measured with the programmable oscillator in an unprogrammed state, such that the crystal frequency itself is measured. Preferably, the tuning sensitivity of the system is also measured, by testing the crystal output over a range of available tuning values. Typically, a small number of measured values are required, for example, eight measurements within a seven-bit tuning system. While the output frequency for each bit combination could also be measured, e.g., all 128 values for a seven bit range, but this is not necessary, as the tuning effects may generally be accurately predicted based on a sparse sampling of this range, preferably testing the sensitivity of each bit, but not necessarily separately. The tuning effects of bits, which represent added capacitance on the crystal, and which lower its operating frequency, are typically non-linear; therefore, a lower order bit will have a reduced effect on output, e.g., result in a lower ppm change, when the total capacitance load on the crystal is higher.

The sensitivity of the tuning bits is tested using a temporary programming technique. e.g., a shadow register. By altering the contents of the shadow register, the capacitive effect of the tuning capacitor loading on the crystal is determined without permanently modifying the oscillator. Thus, the tuning sensitivity may be determined before programming the oscillator, which in the unprogrammed state (e.g., CY2037) outputs the crystal reference without regard for the P, Q and divider select.

In the case of a DCVCTCXO, (e.g., combination MAS1175 and CY2037), the temperature compensation network (e.g., MAS1175) may also be maintained in an unprogrammed state until the coefficients for the digital PLL divider network (CY2037) are calculated. This allows, in the event of an undersirable set of P, Q, and divider ratio, a selection of an alternate set of temperature compensation parameters (than those provided by the normal algorithm) to be programmed. Thus, in the same way that the trim capacitor values are temporarily calculated in a DCXO embodiment before storage in non-volatile memory, likewise, the temperature compensation circuit may also be used to provide an additional variable to optimize the circuit performance.

After the base frequency and tuning sensitivity of the oscillator are determined, an optimum set of tuning bits, multiply and divide (P and Q) ratios and divider select is determined to minimize ppm error. Since the tuning bits are uncommitted before programming, this provides an additional degree of freedom for selection of the programming conditions of the oscillator as compared with prior designs. In conjunction with high precision P and Q parameters, the method and system according to the present invention achieves higher quality, lower costs, and field programmability. Advantageously, the crystals do not undergo a final plate process, and thus retain low phase noise and jitter.

After the tuning sensitivity is determined, multiply, divide and divider select parameters are calculated, and all are programmed into the device, i.e., in non-volatile memory. Advantageously, a CY2037 device permits a second programming of the oscillator time, in a second register set, allowing device reuse or reallocation, and further minimizing scrap.

The frequency of the oscillator is determined with a frequency counter, which may be internal to the programming device or provided as an external system. Preferably, the system architecture provides a personal computer for interface and control, a frequency counter, for example an IEEE-488 device, and a personality module that performs the direct logical interfacing with the oscillator. However, a single system may be provided, or the functions separated between modules differently. The personality module may be a low cost design, allowing separate dedicated personality modules to be provided for each particular type of oscillator device. The personal computer and frequency counter may be general resources, and need not be dedicated to oscillator programming. It is noted that the personal computer is merely a convenient interface and processing resource, and may be substituted as desired. Using a modern generation personal computer, the entire programming operation is completed in less than 20 seconds per oscillator.

Another embodiment of the invention integrates all required interface and intelligence within the personality module, which in this case is a complete programmer. Likewise, the personality module may include an embedded Web server and communicate with an arbitrary device through a TCP/IP protocol, over any conveniently provided physical transport layer. Because the set of parameters to be analyzed for optimality is large, and the personality module, without having to search the parameter space for the optimum solution, requires little intelligence, it is preferred to employ a separate processor for determining the optimal parameters.

It is also possible to leave the tuning bits unprogrammed, operating the oscillator through the contents of the shadow register. This allows, for example, digital control over the tuning during operation, for example to construct a digital temperature compensated oscillator (TCXO). On the other hand, traditional TCXO compensation techniques may also be employed, with the device including analog temperature compensation network (such as the MAS1175) subjected to the tuning and parameter optimization process. In the case of a digital TCXO, a simple thermal sensor interfaces with a simple microcontroller, which then reprograms the tuning bits in the shadow register as necessary to maintain the desired output frequency. Such a digital scheme may also be employed to generate a spread spectrum oscillator output, a fine chirp, or other desired waveforms.

The typical programming algorithm according to the present invention is executed based on the following scheme. An error tolerance is defined, which is the ppm error from a nominal output frequency. The crystal frequency and tuning sensitivity is determined. The algorithm then searches for sets of parameters that translate the measured crystal frequency into the desired frequency, within the error tolerance band. It is generally desirable to employ the lowest divide ratio, Q. The divider select factor provides octave scaling of the frequency over a range of, e.g. seven octaves (CY2037). Therefore, the algorithm searches the parameter space in order of ascending Q for acceptable parameter sets.

In order to achieve low ppm error, phase noise and jitter, it is often desirable to prioritize available parameter sets by Q, ppm error, and divider select, at a mid-tuning range nominal tuning value. The parameter sets are also searched for acceptable sets using tuning values other than the nominal. If necessary, the effect of a proposed tuning value may be tested, to ensure that the results are as expected.

As stated above, where an external temperature compensation network is provided, the tuning function is generally incorporated in this external compensation network. However, the preferred programming method is similar, and involves deferring committing to oscillator trimming values until after the DCXO parameters are selected.

A typical acceptable DCXO error tolerance is 150 ppm, which may be available without use of tuning values at all. On the other hand, according to the present invention, the error may typically be held to within ±1 ppm. In this case, it is often desirable to activate the four high tuning bits, since this will increase the tuning resolution of the remaining bits. For example, in the CY2037, between the 0000000–0000001 tuning states, the least significant bit has a sensitivity of about 8 ppm; between the 1111110–1111111 states, the least significant bit has a sensitivity of about 2 ppm. Limiting the tuning parameter range will, however, make finding an acceptable set of parameters more difficult.

Thus, with the high level of precision afforded by, for example, the CY2037, it is possible to avoid the "final plate" operation of fabricating an oscillator, using a raw crystal having an error of, for example, up to 2,000 to 3,000 ppm from a nominal desired value. In accordance with the present invention, a program executing on a local host or embedded processor reads a value of the oscillator output and tuning sensitivity, and calculates values of P, Q, and divider select to achieve a desired output frequency range. The tuning algorithm then compensates for residual error, within an error tolerance. For example, such a program is written in Visual Basic™, C, and Access database languages.

This switch capacitor tuning, for potential elimination of the final plate process, takes advantage of the following equation for crystal frequency vs. load capacitance, per equation 2:

$$F_1 = F_r \cdot (C_1/(2*C_0+C_L)+1) \quad \text{Eq. 2}$$

This method therefore measures the $F_1$, at 8–15 tuning values, for example of a CY2037 device. This implies an approximate value for $C_1$ at each tuning value, and then allowing calculation of $F_r$, $C_0$, $C_1$ and $C_{stray}$. This results in the ability to tune the finished oscillator, even with a relatively inaccurate crystal.

The programming interface provides both read and write functions. For reading, the system allows confirmation of the CY2037 and confirmation of the full programming of the CY2037. For writing, the system allows selection of current row, programming of the selected row, and loading of the shadow register with a specified bit pattern.

Where the output is intended to be human readable, the read bit pattern may be annotated, and therefore decoded into portions. In addition, the programming device may act as a translator for multiple oscillator types, and therefore have different personalities. In that It case, the annotation feature is, for example, part of a normalization feature for data input and output. Typically, however, the required interface is specific for a certain type of oscillator device, and it is more efficient to provide separate personality modules than a multifunctional programming device.

The programmer preferably interfaces with a standard serial port, e.g., an RS-232 port at 9600 Baud, no parity, 8 data bit and 1 stop bit. Of course, other interfaces could be used. including parallel (Centronics), USB, IEEE-488, Firewire (IEEE-1394), I2C bus, or the like. Further, the programmer may employ an HTML interface and act as an embedded web server, for example including a 10 Base T interface with TCP/IP communications protocol.

Typically, the host system will determine the programming parameters, e.g., P, Q, divider select and tuning bits, and for example, may be fully automated, using a predetermined program to communicate with both frequency counter and programming board.

Alternately, the human user interface may be used to manually enter data into a terminal program, for communication to the programming device. Thus, a separate application may be used to determine appropriate multiply, divide, scaling (divider select) ratios and tuning for the desired output frequency, based on the measured crystal frequency characteristics. The user then transfers these to the programming device through the terminal program.

In the case of an automated testing system, the programming device may be directly controlled by an application program, without use of a manual terminal program interface. In this case, raw, unparsed data may be communicated between the programming device and host computer. However, if the programming device is designed to handle multiple oscillator designs, then a data parser may be of use to standardize communications and the application software, in spite of differences in the oscillator integrated circuit design.

The interface for the CY2037 is a four wire interface. The device implements the required Clock/Data In line switch (data/clock), Vpp/Pgm line switch (shift register enable/disable) and Vdd selection (shift/operate), as well as the required programming sequence. The fourth line is a ground.

It is therefore an object of the invention to provide a method for programming a digitally tunable oscillator, comprising the steps of receiving a desired output frequency; determining a tuning effect of a set of digital tuning words on a crystal resonant frequency; calculating valid parameters of an algorithm for translating and tuning the crystal resonant frequency to a value within an error tolerance of the desired frequency, based on the determined tuning effect; and programming in a nonvolatile memory a valid set of calculated parameters.

It is a further object of the invention to provide an apparatus for programming a digitally tunable oscillator, comprising an input for receiving a desired oscillator frequency; an input for receiving an output frequency of the digitally tunable oscillator; a control for selecting a plurality of tuning states of the oscillator; a computer program for calculating valid parameters of an algorithm for translating and tuning the crystal resonant frequency to a value within an error tolerance of the desired frequency, based on received output frequency of the oscillator during the plurality of tuning states; and a programmer for programming a nonvolatile memory of the oscillator with a valid set of calculated parameters.

It is a still further object of the invention to provide a computer readable medium, containing a program for performing the steps of receiving a desired output frequency; determining a tuning effect of a set of digital tuning words on a crystal resonant frequency; calculating valid parameters of an algorithm for translating and tuning the crystal resonant frequency to a value within an error tolerance of the desired frequency, based on the determined tuning effect; and outputting at least one set of calculated valid parameters.

According to various embodiments of the invention, a desired maximum error tolerance is input, constraining the set of valid oscillator control parameters.

The oscillator is preferably a phase lock loop frequency synthesizer having a multiply parameter and a divide parameter for the frequency translation. The oscillator also preferably has a capacitive load on the crystal, controllable by a digital tuning word to alter a resonant frequency thereof. According to various embodiments of the invention, substantially all available parameters are evaluated in order to determine the potentially valid parameters which meet all design requirements. Alternately, a subset of the theoretically available parameters may be evaluated, for example, where bits of the oscillator memory are preprogrammed, or where other considerations are mandated.

It is another object of the invention to provide a system and method for programming a programmable oscillator having a nonvolatile memory for persistently storing a control algorithm and a tuning control, wherein the tuning effect is determined before programming of nonvolatile memory with the control algorithm. Therefore, the control algorithm is constrained only by a set of available parameters while determining the tuning control, allowing greater degrees of freedom in calculating the valid parameters.

It is a further object of the invention to provide a separate oscillator programming control and calculating means, and communicating the valid set of parameters between the calculating means and oscillator programming control. Thus, the oscillator programming control need not include a human interface or calculating means, simplifying design and reducing oscillator programming control costs.

It is a still further object of the invention to provide a method and system for programming an accurate oscillator wherein the crystal frequency source is grossly tunes and/or is not subject to a final plate process.

It is another object of the invention to provide a system and method for programming an oscillator having a phase locked loop frequency synthesizer and a crystal tuning parameter, wherein the phase locked loop has a multiply parameter and a divide parameter for frequency synthesis from a crystal frequency, and wherein the valid tuning, multiply and divide parameters are calculated based on an intermediate tuning value, sorted by ascending divide parameter, and then evaluated in sorted order for ability of a tuning effect to null frequency error to within a predefined error tolerance.

These and other objects and features of the present invention will become more fully apparent from the following description and appended claims taken in conjunction with the accompanying drawings, in which like numerals refer to like parts.

BRIEF DESCRIPTION OF THE DRAWINGS

The invention is shown in the drawings, in which:

FIGS. 6A and 6b show a schematic drawing of a preferred embodiment of a programming device according to the present invention;

DETAILED DESCRIPTION OF THE PREFERRED EMBODIMENT

Figure 1A:
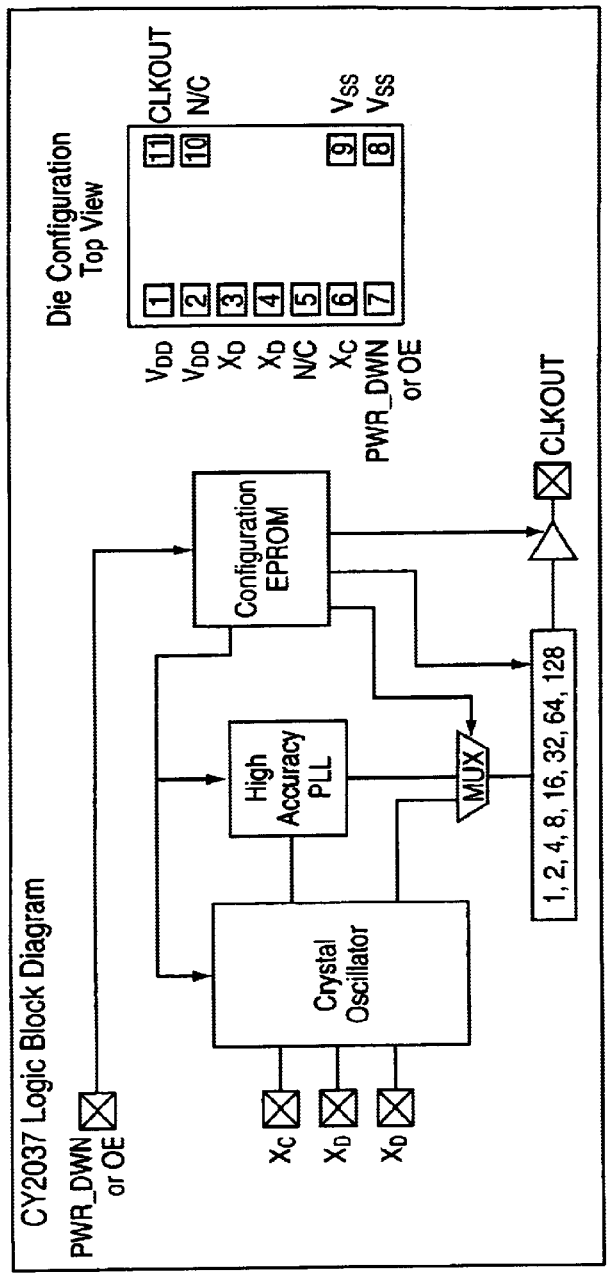
FIGS. 1A and 1B show block diagrams of a known CY2037 device.

The invention will now be described by way of the drawings, in which corresponding reference numerals indicate corresponding structures in the figure.

EXAMPLE 1—DCXO

Figure 1B:
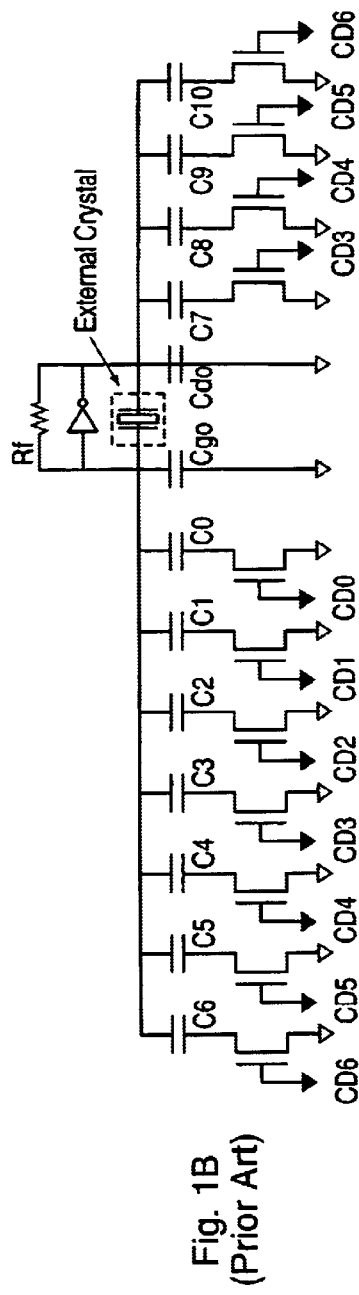
Figure 3:
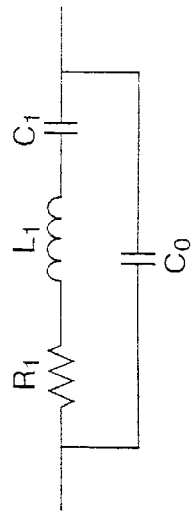
FIG. 3 shows an equivalent circuit of a quartz crystal.
Figure 4:
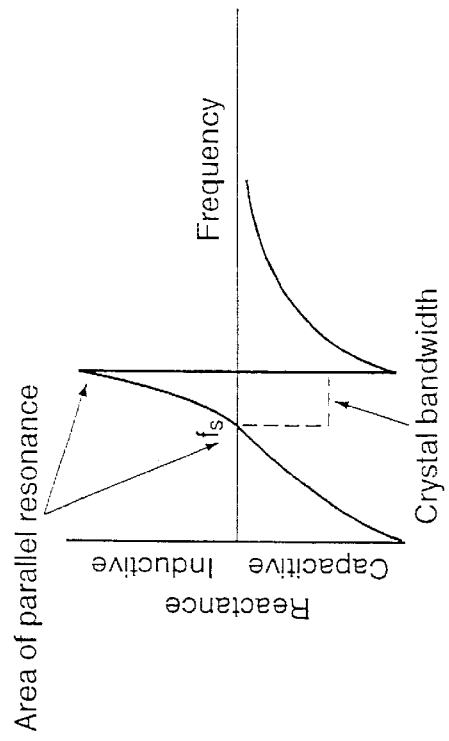
FIG. 4 shows the effective reactance curve of the crystal shown in FIG. 3.
Figure 2:
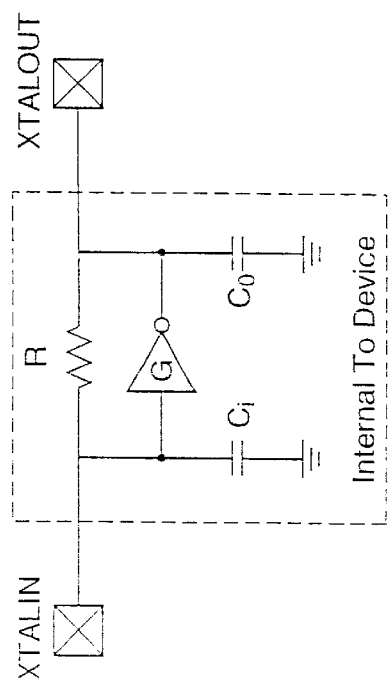
FIG. 2 shows the circuitry of an on-chip crystal oscillator.

As shown in FIG. 1A, the CY2037 provides a high accuracy PLL, sets of EPROM configuration registers, a crystal oscillator, and a divisor select. FIG. 1B shows the programmable set of tuning capacitors for controlling and tuning an oscillator frequency.

Figure 5:
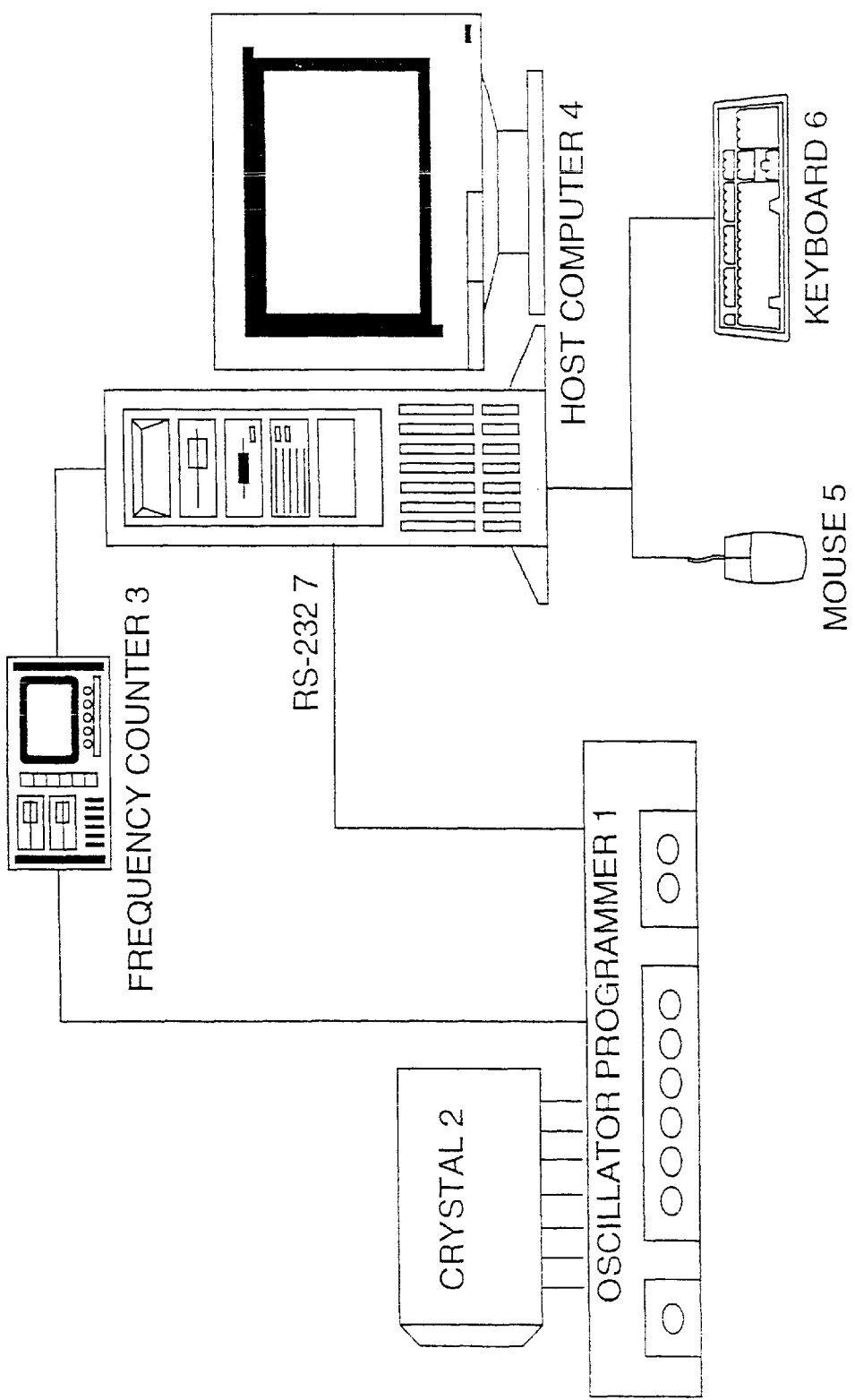
FIG. 5 shows a simplified block diagram of an oscillator programming system according to the present invention.

FIG. 5 shows that a programming device 1 interfaces with a host computer 4 through an RS-232 serial interface 7, a frequency counter 3, which may be a separate module, or integrated in the host computer 4 or programming device 1, providing a reading of the output frequency of the crystal oscillator (device under test) 2 to the personal computer 4, and that the programming device 1 interfaces with the crystal oscillator 2 for programming thereof. The host computer 3 has a display screen, keyboard 6 and mouse 5 for its user interface.

FIGS. 6A and 6B show a schematic drawing of a preferred embodiment of the invention. The programming device encompasses a microcontroller, for example an Atmel 89C52, a serial interface driver, for example a Linear Technology LT1182, for communication with the host computer 3 using RS-232 (see FIG. 6A), various power supply regulation components (not shown), a set of digital buffer circuits (see FIG. 6B) and a socket for the device under test (DUT).

During use, the microcontroller of the oscillator programming device 1 communicates with a host computer 4 system, which employs a customized application for communicating with the programming device 1.

Figure 7A:
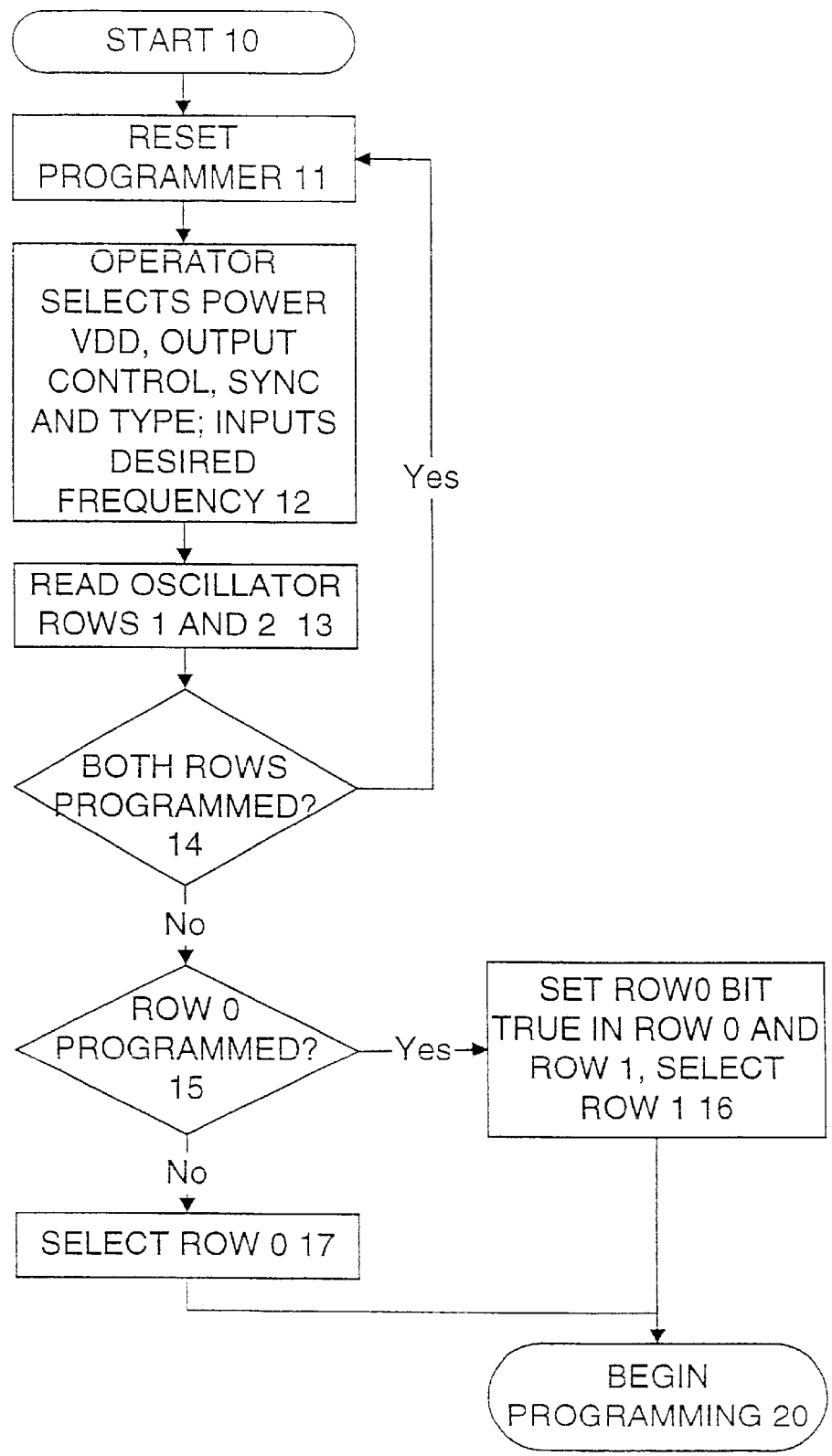
FIGS. 7A and 7B show flow charts of a preferred method according to the present invention.
Figure 7B:
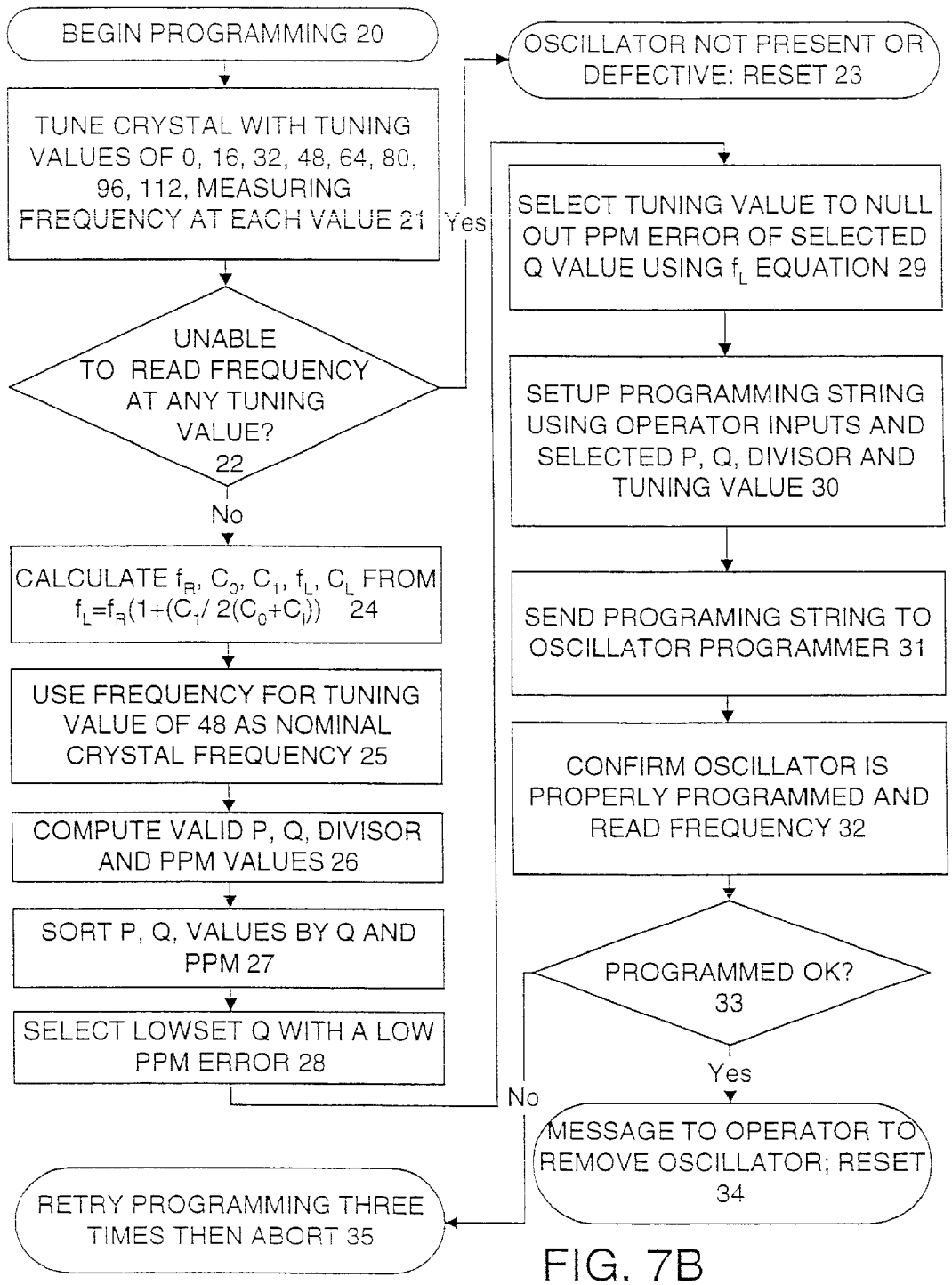

As shown In FIGS. 7A and 7B, the controller is initially reset to a starting state 11. The operator then selects Power Vdd, Output Control, Sync and Type for the oscillator, and the desired operating frequency 12.

The controller then reads both rows of the device, to determine whether they are already programmed 13. Only in rare circumstances can a row of the oscillator be reprogrammed, i.e., only where the new program exclusively requires a change in any bits from a 0 state to a 1 state. Therefore, the controller is normally reset if both rows are already programmed 14. If row 0 is not programmed 14, then the process seeks to program this row 17, otherwise, row 1 is programmed 16. If row 1 is to be programmed, the Row0 bit is set to 1 in both rows 0 and 1.

Oscillators may be programmed more than 2 times for a reduced number of frequencies by searching for P, Q and Divider select by determining values of each where the bits previously programmed in row 1 are zero. For example, if the P value in row 1 is 000100100001 then it could be reprogrammed with any P value that changes a zero bit to 1, i.e., 100100100001.

If a set of P, Q and Divider select values where only the zero bits are changed for the desired new frequency can be found, then the oscillator can be programmed more than 2 times. There will be a reduced set of these values to select from compared to un-programmed parts.

The shadow register of the selected row is then set to values of 0, 16, 32, 48, 64, 80, 96 and 112, sequentially, and the output frequency measured, thus testing the highest three bits of tuning values 21. The lower bits are less critical, and generally of more uniformity, so actual measurements are generally not required.

In this tuning process, if the output frequency is unreadable 22, the oscillator is either not present or defective, and the controller is reset for the next set of tests 23.

Based on the tuning measurements and the desired output frequency, the values $f_R$, $C_0$ and $C_1$ are calculated 24 from known $f_L$ and $C_L$ per equation 2:

$$F_1 = F_r \cdot (C_1/(2 \cdot C_0 + C_L) + 1) \qquad \text{Eq. 2}$$

The base frequency $f_R$ used is, in this case, the tuning value 48 frequency, allowing both positive and negative deviations during optimization 25. The set of valid parameters P, Q, divider select, and ppm error values are then computed, within the frequency limits of the device 26.

The set of valid parameters P, Q are then sorted by Q and ppm 27, and the lowest Q value, with a low ppm error is selected 28. In the equation employed by the phase locked loop, the P/Q fraction is reduced to simplest form.

The tuning value is then selected to best null out the ppm error of the selected Q value 29 using the $f_L$ equation.

The programming string established 29 and then sent to the controller, including P, Q, divider select, and tuning value 30, which is then programmed into the EPROM row register of the device. The oscillator is then checked to see if it is properly programmed 33; if not, the writing of the EPROM is retried up to three additional times 35. If the device is still not properly programmed, the operation is aborted. If successfully completed, the operator is so informed 34, and the device reset for a new programming cycle.

EXAMPLE 2—TCVCDCXO

Figure 8:
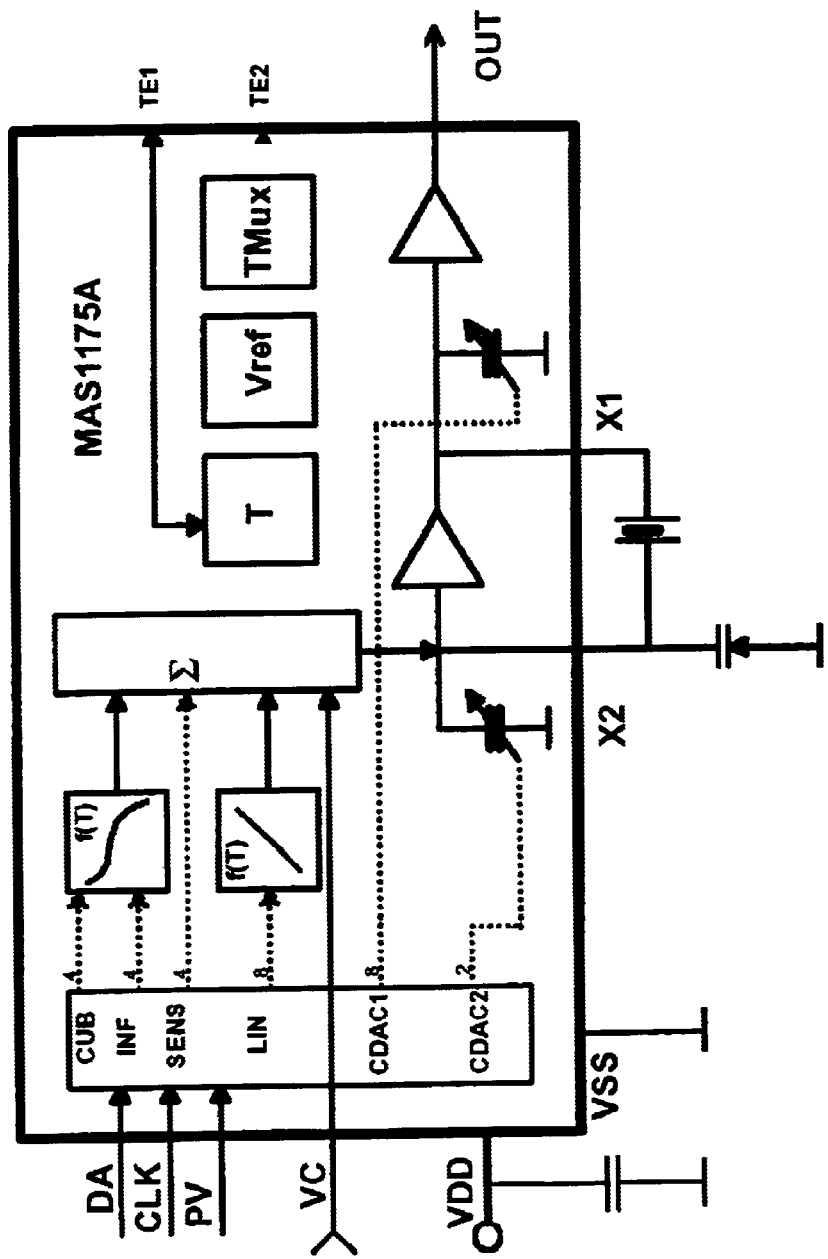
FIG. 8 shows a block diagram of a known MAS1175 device.

The circuit of Example 1 is modified by substituting the output of an MAS1175 oscillator, shown in FIG. 8, for the crystal in the circuit of FIG. 1B, with the output of the MAS1175 connected to the input $X_G$ of the CY2037. Therefore, the tuning capacitor network of the CY2037 will be ineffective, and thus need not be present. The programming device shown in FIG. 5 is used, with a different oscillator programmer 1 personality module, shown in more detail in FIGS. 6A and 6B, designed for this part. In particular, the circuit of FIG. 6B additionally handles the clock, data, and programming input pins of the MAS1175. These signals (along with possibly other test and diagnostic signals) may be brought to pins on the oscillator package.

The programming method incorporates the initial CY2037 programming steps shown in FIG. 7A and the selection of operating and oscillator trimming values as shown in FIG. 7B, with the possible exception of the selection of test trimming values. In FIG. 7B, these are selected as 0, 16, 32, 48, 64, 80, 96, 112, which were found to be optimal for detecting the characteristics of the CY2037 tuning network. Rather, for the MAS1175, which has a 25% tolerance of the capacitive trimming network, each bit may be tested, e.g., 0, 1, 2, 4, 8, 16, 32, 64, 128, 256, 512, or various bit combinations may be tested. It is noted that the MAS1175 provides a transparent register mode where the compensation reads either the values stored in the EPROM or shift register, allowing the circuit to be functionally tested prior to programming.

Figure 9:
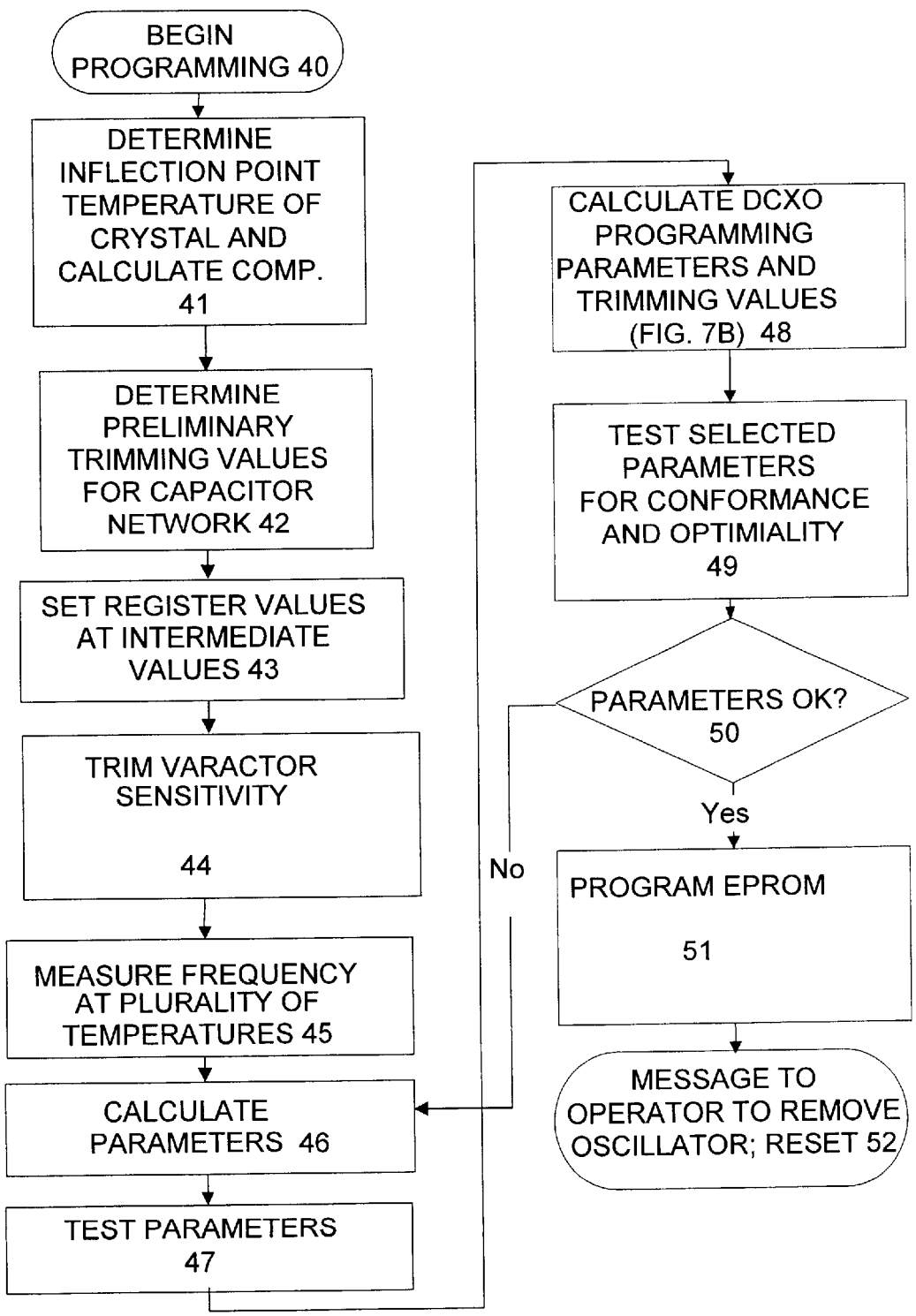
FIG. 9 shows a flow chart of a preferred method for programming a VCTCDCXO according to the present invention.

Prior to performing the steps shown in FIG. 7B, for tuning the oscillator and selecting the DCXO coefficients, the temperature compensation parameters are defined. In fact, the temperature compensation functions of the MAS1175 may remain unprogrammed after calculation, in order to allow greater flexibility in selecting the DCXO operating parameters. FIG. 9 shows the measurement of temperature sensitivity, calculation of parameters, and programming of the temperature compensation network.

The measurement of temperature sensitivity involves holding the oscillator while operating at a determined temperature, while measuring the output frequency using an external frequency reference. The crystal may be placed in an oven or environmental chamber, and tested over its operating temperature range, for example 0° to 50° C. Typically, the oscillator is tested under its rated or nominal load, and allowed to stabilize prior to taking a measurement.

As shown in FIG. 9, the oscillator circuit is tested under a plurality of temperature conditions, for example at least three temperatures. This data is then used to calculate the temperature dependence of the oscillator. The MAS1175 provides parametric control for linearity, a cubic term, an inflection point, and a sensitivity (for the voltage control over the varactor).

The programming is initialized 40 by entering a programming mode in the personality module of the programmer. The inflection point temperature of the crystal is then determined, and inflection point control programmed 41 to compensate for this. The frequency offset is then preliminarily compensated 42, but not programmed, with other registers temporarily set to intermediate values 43. The varactor sensitivity is trimmed to a desired sensitivity 44, using the sensitivity register. With the system preliminarily trimmed, the frequency output with at least three different temperatures (inflection and linearity) or at least four different temperatures (inflection, linearity and cubic term sensitivity) is measured 45. The parameter values to achieve a flat frequency response are then calculated 46. The circuit may then be tested using the proposed values, prior to programming 47.

The method shown in FIG. 7B is then employed 48 for determining optimal DCXO parameters and capacitive tuning values. The calculated parameters are then tested 49 by operation of the oscillator at room temperature. If these values are not problematic 50, and if the values are within tolerance, the various EPROM registers programmed 51. A message is then delivered by the programmer 1 to remove the programmed oscillator and reset the system 52.

On the other hand, if the determined parameters, especially the divide ratio Q, are problematic, i.e., the divide ratio is too high, based on available P, Q, divide ratio, and tuning values, then the temperature compensation values may be recalculated 46 seeking to shift the output frequency sufficient to allow desirable DCXO parameters. In this case, it is preferred that, after recalculation of the temperature compensation parameters, that the oscillator be verified for operation over temperature 49, since the temperature compensation values will be non-optimal. For example, by adjusting the cubic sensitivity term, inflection point, and linearity, a new operating point may be achieved which alters the crystal operating frequency yet which meets functional tolerances and specifications.

EXAMPLE 3

Figure 10A:
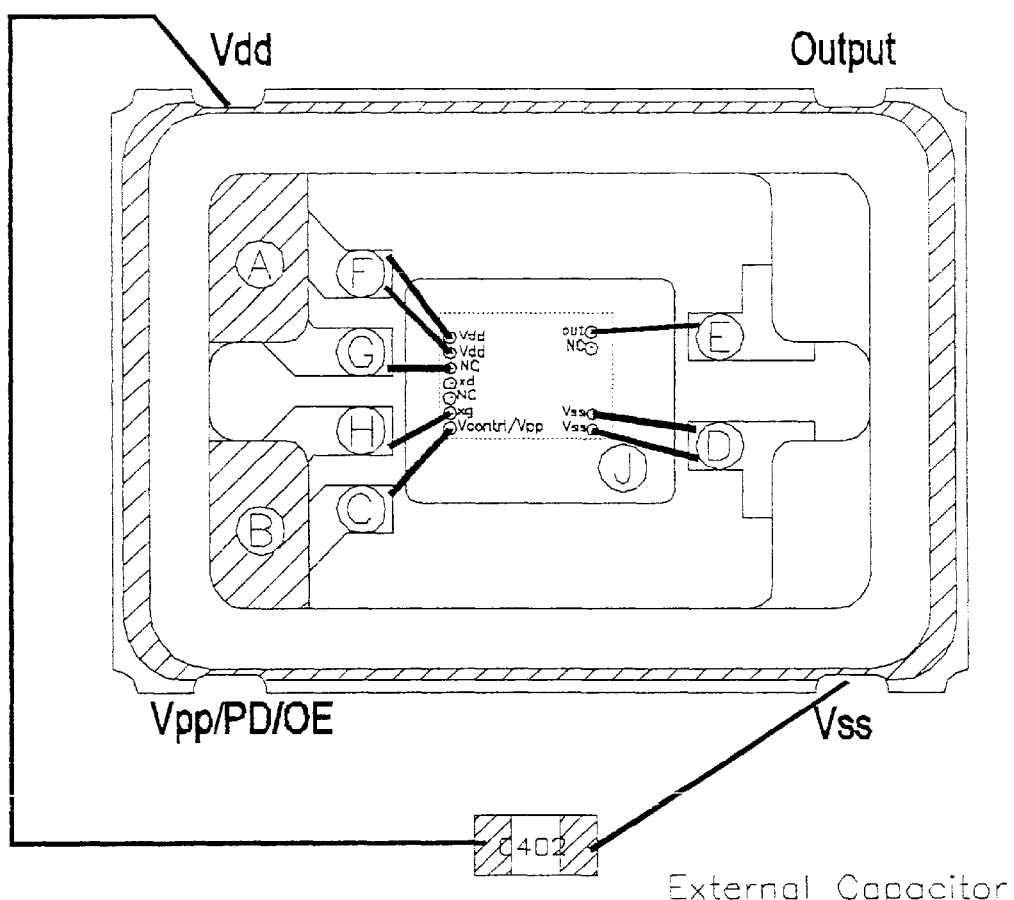
FIG. 10A shows an oscillator housing package having therein a quartz crystal, semiconductor integrated circuits, varactor, and external, bypass capacitor of the prior art
Figure 10B:
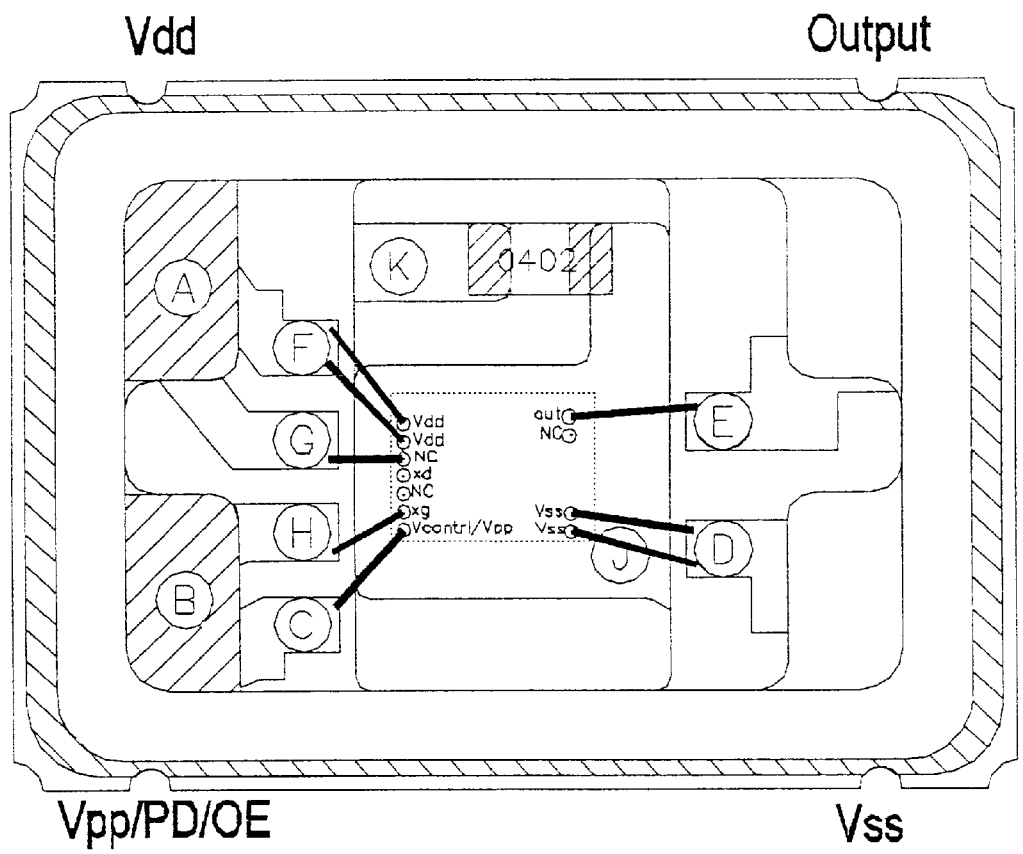
FIG. 10B shows the oscillator package with internal bypass capacitor according to the invention.

FIG. 10A shows a prior art packaged oscillator having an external power supply bypass capacitor. Typically, packaged PLL oscillators has relied on external bypass capacitors. Some known non-PLL oscillators have included internal bypass capacitors, in larger package sizes. FIG. 10B shows a packaged PLL oscillator having an internal power supply bypass capacitor according to the present invention. According to this embodiment, a 10–100 nF chip capacitor is provided within the oscillator housing for power supply bypassing.

FIGS. 11A and 11B, and 11C and 11D shows, respectively, comparative tracings of the jitter distributions between the comparative example of FIG. 10A and the example of FIG. 10B for 100 MHz (FIGS. 11A and 11B) and 40 MHz (FIGS. 11C and 11D) PLL oscillators, respectively. In each case, the non-bypassed oscillator displays a bimodal (or in some cases, not shown, a trimodal distribution), while the PLL oscillators with internal bypass capacitors have lower overall jitter with a Gaussian distribution.

These jitter measurements were obtained using an HPE3631A Power Supply, feeding an oscillator under test under rated load in a test fixture. A LeCroy LC684DXL Oscilloscope with PPO96 8 GS/S adapter, with an input from an HP 1144A Active Probe with HP 1142 Power supply acting as input. A 10 MHz timebase is provided by an HP 53121A Frequency Counter. The Oscilloscope and Frequency Counter communicate with a personal computer using a GPIB control bus.

Figure 11A:
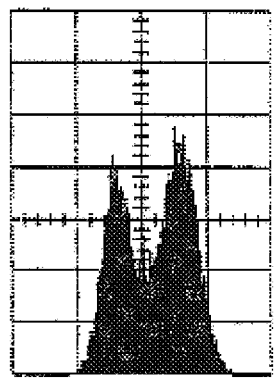
FIG. 11A shows jitter in a 100 MHz PLL oscillator without an internal bypass capacitor according to the prior art.
Figure 11B:
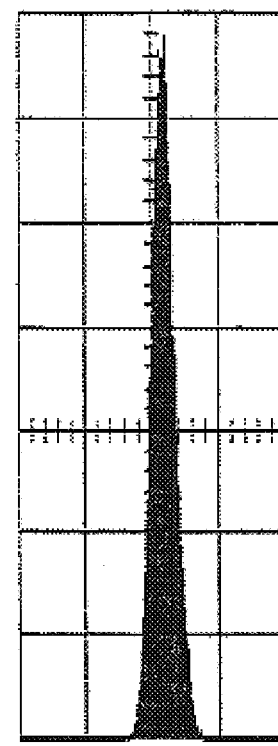
FIG. 11B shows jitter in a 100 MHz PLL oscillator with an internal bypass capacitor according to the present invention.
Figure 11C:
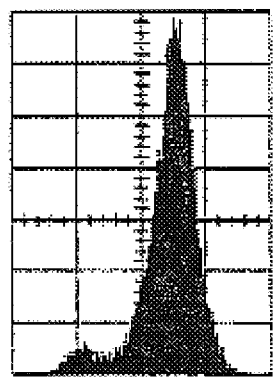
FIG. 11C shows jitter in a 40 MHz PLL oscillator without an internal bypass capacitor according to the prior art.
Figure 11D:
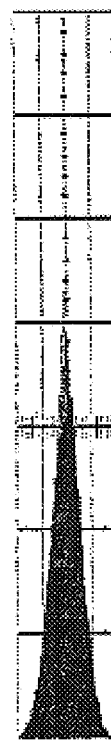
FIG. 11D shows jitter in 40 MHz PLL oscillator with an internal bypass capacitor according to the present invention.

Each horizontal division is 10.0 i. FIG. 11A represents 25,972 jitter counts, FIG. 11B represents 25,973 jitter counts, FIG. 11C represents 25,086 jitter counts and FIG. 11D represents 25,036 jitter counts. Each oscillator was tested with a supply voltage of 3.3 V and an output load of 15 pF (100 MHz) or 30 pF (40 MHz).

For FIG. 11A, the period is 30.519 ns, the low is 30.4143 ns, the high is 30.5878 ns, the range is 173.50 ps and the sigma is 43.21 ps. For FIG. 11B, the period is 30.519 ns, the low is 30.4798 ns, the high is 30.5523 ns, the range is 72.50 ps and the sigma is 10.06 ps. For FIG. 11C, the period is 24.998 ns, the low is 24.8966 ns, the high is 25.0636 ns, the range is 167.00 ps and the sigma is 23.23 ps. For FIG. 11D, the period is 24.999 ns, the low is 24.9416 ns, the high is 25.0516 ns, the range is 110.00 and the sigma is 12.29 ps.

Figure 12:
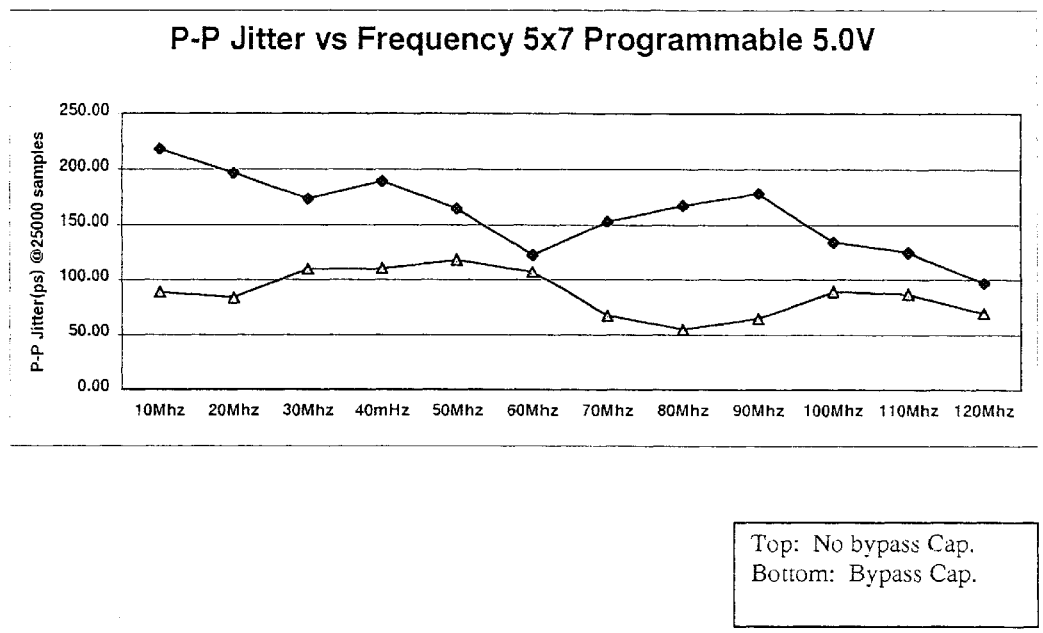
FIG. 12 shows a graph of jitter vs. frequency for a PLL oscillator with an internal bypass capacitor.

FIG. 12 shows a comparison of phase jitter measurements between an externally bypassed embodiment (FIG. 10A), an internally bypassed embodiment (FIG. 10B), over a range of frequencies. As shown in FIG. 12, the non-bypassed PLL oscillator represented in the upper tracing always has greater jitter than the internally bypassed PLL oscillator, over a broad range of frequencies.

While the above detailed description has shown, described and pointed out the fundamental novel features of the invention as applied to various embodiments, it will be understood that various omissions and substitutions and changes in the form and details of the system and method illustrated may be made by those skilled in the art, without departing from the spirit of the invention. Consequently, the full scope of the invention should be ascertained by the appended claims.

What is claimed is:

1. A method for programming a digitally tunable oscillator, comprising the steps of:
    (a) defining a desired output frequency of the digitally tunable oscillator;
    (b) determining a tuning effect of a set of digital tuning words on a crystal resonant frequency with respect to a reference, a tuning range of the crystal resonant freguency not overlapping the desired output frequency of the digitally tunable oscillator;
    (c) calculating valid parameters of an algorithm for translating and tuning the crystal resonant frequency to a value, such that when the tuned crystal resonant frequency is translated, the digitally tunable oscillator output frequency is within an error tolerance of the desired frequency, the algorithm producing at least two distinct valid sets of parameters;
    (d) selecting one set of calculated sets of valid parameters of the algorithm for tuning and translating the crystal resonant frequency;
    (e) programming in a nonvolatile memory the selected set of calculated parameters.

2. The method according to claim 1, further comprising the steps of:
    (f) determining a temperature sensitivity of the crystal;
    (g) calculating a set of temperature compensation parameters; and
    (h) programming in a nonvolatile memory a set of calculated temperature compensation parameters.

3. The method according to claim 1, wherein the digitally tunable oscillator also receives an analog tuning signal.

4. An apparatus for programming a digitally tunable oscillator comprising:
    (a) an input for receiving a desired oscillator frequency;
    (b) an input for receiving an output frequency of the digitally tunable oscillator;
    (c) a control for selecting a plurality of tuning states of the oscillator;
    (d) a computer program for calculating valid parameters of an algorithm for translating and tuning the crystal resonant frequency to a value within an error tolerance of the desired oscillator frequency, based on received output frequency of the oscillator during the plurality of tuning states, a tuning range of the crystal resonant frequency not overlapping the desired oscillator frequency, the algorithm producing at least two distinct sets of valid parameters; and
    (e) a programmer for programming a nonvolatile memory of the oscillator with a selected valid set of calculated parameters.

5. The apparatus according to claim 4, further comprising means for determining a temperature sensitivity of the crystal and a computer program for calculating a set of temperature compensation parameters.

6. A phase locked loop oscillator, having an oscillator crystal, a phase locked loop integrated circuit, a circuit substrate for mounting the oscillator crystal and phase locked loop integrated circuit, and a cover, the improvement comprising providing a power supply bypass capacitor on the circuit substrate and within cover, said circuit substrate and cover sealing said oscillator crystal, said phase locked loop integrated circuit, and said power supply bypass capacitor from the environment, providing an external electrical interface, and providing an operative electrical connection between said phase locked loop integrated circuit and said power supply bypass capacitor without intervening inductance from said external electrical interface.

7. A phase locked loop oscillator, comprising an oscillator crystal, a phase locked loop circuit, a parametric higher order temperature compensation circuit, and a crystal frequency trimming circuit, within a common sealed housing.

8. An oscillator, comprising, within a single sealed package, an electromechanical resonator; an electrical oscillator circuit for exciting and trimming said electromechanical resonator; a temperature sensor; a parametric higher order control, receiving an output of said temperature sensor and adjusting said electrical oscillator circuit to trim said electromechanical resonator; and a frequency translator for translating an oscillator output to a different frequency, wherein said control and said frequency translator are each responsive to stored digital parameters.

9. The oscillator according to claim 8, wherein a jitter of said electrical oscillator circuit is less than about 220 ps peak-to-peak.

10. The oscillator according to claim 8, wherein a jitter of said electrical oscillator circuit is less than about 120 ps peak-to-peak.

11. The oscillator according to claim 8, further comprising a power supply bypass capacitor within said single sealed package.

12. The oscillator according to claim 8, wherein said oscillator is a VCTCXO.

13. The oscillator according to claim 8, wherein said electromechanical resonator is a quartz crystal.

14. The oscillator according to claim 8, wherein said electrical oscillator circuit comprises a varactor.

15. The oscillator according to claim 8, wherein said control evaluates a digital algorithm for trimming said electromechanical resonator based on said output of said temperature sensor.

16. The oscillator according to claim 15, wherein said control applies an analog trim signal to a varactor of said electrical oscillator circuit.

17. The oscillator according to claim 8, wherein said frequency translator comprises a digital circuit for multiplying and dividing an oscillator output of said electrical oscillator circuit to produce a translated frequency output of said different frequency.

18. The oscillator according to claim 8, further comprising a set of digital storage registers, at least one of said registers being rewritable and at least one of said registers having persistent storage of data.

19. The method according to claim 1, wherein one of the valid sets of parameters for the algorithm is selected to optimize a jitter performance of the digitally tunable oscillator.

20. The apparatus according to claim 4, wherein one of the valid sets of parameters for the algorithm is selected to optimize a jitter performance of the digitally tunable oscillator.

21. A method for programming a digitally tunable oscillator, comprising the steps of:
    (a) receiving a desired output frequency;
    (b) determining a tuning effect of a set of digital tuning words on a crystal resonant frequency;
    (c) calculating valid parameters of an algorithm for translating and tuning the crystal resonant frequency to a value within an error tolerance of the desired frequency, based on the determined tuning effect;
    (d) programming in a nonvolatile memory a valid set of calculated parameters;
    (e) determining a temperature sensitivity of the crystal;
    (f) calculating a set of temperature compensation parameters; and
    (g) programming in a nonvolatile memory a set of calculated temperature compensation parameters.

22. A method for programming a digitally tunable oscillator, comprising the steps of:
    (a) receiving a desired output frequency;
    (b) determining a tuning effect of a set of digital tuning words on a crystal resonant frequency;
    (c) calculating valid parameters of an algorithm for translating and tuning the crystal resonant frequency to a value within an error tolerance of the desired frequency, based on the determined tuning effect; and
    (d) programming in a nonvolatile memory a valid set of calculated parameters, wherein the digitally tunable oscillator also receives an analog tuning signal.

23. An apparatus for programming a digitally tunable oscillator, comprising:
    (a) an input for receiving a desired oscillator frequency;
    (b) an input for receiving an output frequency of the digitally tunable oscillator;
    (c) a control for selecting a plurality of tuning states of the oscillator;
    (d) a computer program for calculating valid parameters of an algorithm for translating and tuning the crystal resonant frequency to a value within an error tolerance of the desired frequency, based on received output frequency of the oscillator during the plurality of tuning states;
    (e) a programmer for programming a nonvolatile memory of the oscillator with a valid set of calculated parameters; and
    (f) means for determining a temperature sensitivity of the crystal and a computer program for calculating a set of temperature compensation parameters.

24. An oscillator, comprising, within a single package, an electromechanical resonator; an electrical oscillator circuit for exciting and trimming said electromechanical resonator; a temperature sensor; a control, receiving an output of said temperature sensor and adjusting said electrical oscillator circuit to trim said electromechanical resonator; and a frequency translator for translating an oscillator output to a different frequency, wherein said control and said frequency translator are each responsive to stored digital parameters.

* * * * *